(12) United States Patent
Sakashita et al.

(10) Patent No.: US 10,763,818 B2
(45) Date of Patent: Sep. 1, 2020

(54) ACOUSTIC WAVE DEVICE

(71) Applicant: TAIYO YUDEN CO., LTD., Tokyo (JP)

(72) Inventors: Takeshi Sakashita, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 354 days.

(21) Appl. No.: 15/694,069

(22) Filed: Sep. 1, 2017

(65) Prior Publication Data

US 2018/0083593 A1 Mar. 22, 2018

(30) Foreign Application Priority Data

Sep. 21, 2016 (JP) .................. 2016-184037

(51) Int. Cl.
*H03H 3/08* (2006.01)
*H03H 3/10* (2006.01)
(Continued)

(52) U.S. Cl.
CPC ..... *H03H 9/02937* (2013.01); *H01L 41/0475* (2013.01); *H01L 41/0477* (2013.01); *H01L 41/1873* (2013.01); *H03H 3/08* (2013.01); *H03H 3/10* (2013.01); *H03H 9/02559* (2013.01); *H03H 9/02779* (2013.01);
(Continued)

(58) Field of Classification Search
CPC .......................... H01L 41/075; H03H 9/02937
USPC ....... 310/365, 324, 320, 367, 321, 322, 348, 310/311, 313 C
See application file for complete search history.

(56) References Cited

U.S. PATENT DOCUMENTS

| 9,584,088 B2* | 2/2017 | Kikuchi ............. H03H 9/02559 |
| 2007/0296304 A1* | 12/2007 | Fujii ........................ H03H 3/10 310/313 A |

(Continued)

FOREIGN PATENT DOCUMENTS

| JP | 5-275963 A | 10/1993 |
| JP | 2005-142629 A | 6/2005 |

(Continued)

OTHER PUBLICATIONS

Japanese Office Action dated Mar. 5, 2019, in a counterpart Japanese patent application No. 2016-184037. (A machine translation (not reviewed for accuracy) attached.).

*Primary Examiner* — Thomas M Dougherty
*Assistant Examiner* — Karen B Addison
(74) *Attorney, Agent, or Firm* — Chen Yoshimura LLP

(57) ABSTRACT

An acoustic wave device includes: a piezoelectric substrate; a comb-shaped electrode located on the piezoelectric substrate; a wiring layer located on the piezoelectric substrate and electrically connected with the comb-shaped electrode; a first insulating film located on the piezoelectric substrate, the first insulating film covering the comb-shaped electrode, having an aperture on the wiring layer, and being thicker than the comb-shaped electrode; a second insulating film covering an upper surface of the first insulating film and at least a part of a side surface of the first insulating film in the aperture and having a higher moisture resistance than the first insulating film; and a pad being in contact with the wiring layer exposed by the aperture.

18 Claims, 9 Drawing Sheets

(51) Int. Cl.
- *H03H 9/145* (2006.01)
- *H03H 9/25* (2006.01)
- *H03H 9/02* (2006.01)
- *H01L 41/047* (2006.01)
- *H01L 41/187* (2006.01)
- *H03H 9/64* (2006.01)

(52) U.S. Cl.
CPC ........ *H03H 9/02834* (2013.01); *H03H 9/145* (2013.01); *H03H 9/25* (2013.01); *H03H 9/6483* (2013.01)

(56) References Cited

U.S. PATENT DOCUMENTS

| | | |
|---|---|---|
| 2009/0160574 A1 | 6/2009 | Yamane et al. |
| 2013/0029033 A1 | 1/2013 | Kikuchi et al. |

FOREIGN PATENT DOCUMENTS

| | | |
|---|---|---|
| JP | 2008-28980 A | 2/2008 |
| WO | 2008/038502 A1 | 4/2008 |
| WO | 2012/124210 A1 | 9/2012 |

\* cited by examiner

ACOUSTIC WAVE DEVICE

CROSS-REFERENCE TO RELATED APPLICATION

This application is based upon and claims the benefit of priority of the prior Japanese Patent Application No. 2016-184037, filed on Sep. 21, 2016, the entire contents of which are incorporated herein by reference.

FIELD

A certain aspect of the present invention relates to an acoustic wave device.

BACKGROUND

There have been known acoustic wave devices including a comb-shaped electrode located on a piezoelectric substrate. Covering the comb-shaped electrode with a silicon oxide film to protect the acoustic wave device or compensate the temperature has been known as disclosed in, for example, Japanese Patent Application Publication Nos. 5-275963 and 2008-28980. Forming an insulating film, such as an aluminum oxide film, with a density different from that of the silicon oxide film on the silicon oxide film covering the comb-shaped electrode to achieve the reliability and the temperature characteristics has been known as disclosed in, for example, Japanese Patent Application Publication No. 2005-142629.

In a structure designed to have a comb-shaped electrode covered with an insulating film, an aperture for forming a pad is formed in the insulating film. In this structure, water may penetrate into the insulating film from the upper surface of the insulating film and the side surface of the insulating film in the aperture. The penetration of water into the insulating film deteriorates the characteristics.

SUMMARY OF THE INVENTION

According to an aspect of the present invention, there is provided an acoustic wave device including: a piezoelectric substrate; a comb-shaped electrode located on the piezoelectric substrate; a wiring layer located on the piezoelectric substrate and electrically connected with the comb-shaped electrode; a first insulating film located on the piezoelectric substrate, the first insulating film covering the comb-shaped electrode, having an aperture on the wiring layer, and being thicker than the comb-shaped electrode; a second insulating film covering an upper surface of the first insulating film and at least a part of a side surface of the first insulating film in the aperture and having a higher moisture resistance than the first insulating film; and a pad being in contact with the wiring layer exposed by the aperture.

DETAILED DESCRIPTION

Hereinafter, embodiments of the present invention will be described with reference to the accompanying drawings.

First Embodiment

Figure 1A:
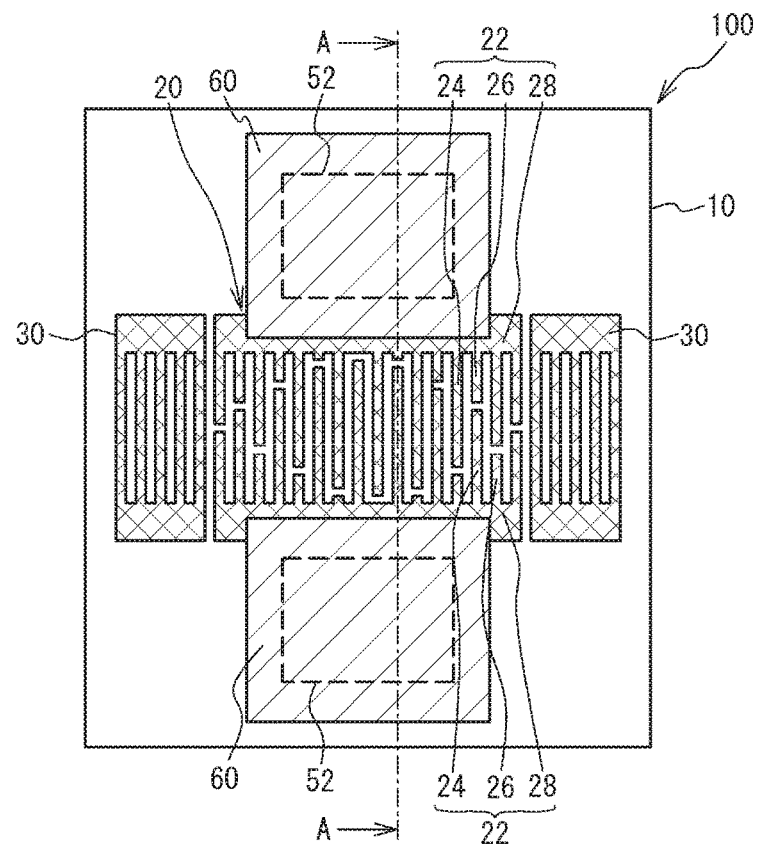
FIG. 1A is a plan view of an acoustic wave resonator in accordance with a first embodiment.
Figure 1B:
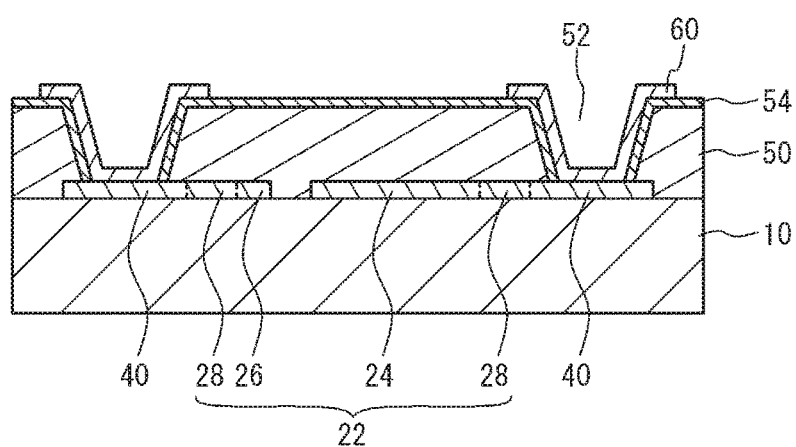
FIG. 1B is a cross-sectional view taken along line A-A in FIG. 1A.

FIG. 1A is a plan view of an acoustic wave resonator 100 in accordance with a first embodiment, and FIG. 1B is a cross-sectional view taken along line A-A in FIG. 1A. In FIG. 1A, the illustration of an insulating film 50 and an insulating film 54 is omitted (the same applies to FIG. 4A, FIG. 5A, FIG. 6A, and FIG. 8). As illustrated in FIG. 1A and FIG. 1B, the acoustic wave resonator 100 of the first embodiment includes an IDT 20 composed of a pair of comb-shaped electrodes 22 and a pair of reflectors 30 sandwiching the IDT 20 on a substrate 10. The substrate 10 is a piezoelectric substrate such as, for example, a lithium tantalate substrate or a lithium niobate substrate. The substrate 10 may be a substrate formed by bonding a piezoelectric substrate on a support substrate such as a sapphire substrate.

The comb-shaped electrode 22 includes a plurality of electrode fingers 24, a plurality of dummy electrode fingers 26, and a bus bar 28 to which the electrode fingers 24 and the dummy electrode fingers 26 are connected. The electrode fingers 24 and the dummy electrode fingers 26 are substantially alternately arranged. The pair of comb-shaped electrodes 22 face each other so that the electrode fingers 24 of one of the comb-shaped electrodes 22 and the electrode fingers 24 of the other are substantially alternately arranged. The ends of the electrode fingers 24 of one of the comb-shaped electrodes 22 face the ends of the dummy electrode fingers 26 of the other of the comb-shaped electrodes 22 across gaps. The acoustic wave excited by the electrode fingers 24 mainly propagates in the arrangement direction of the electrode fingers 24. The pair of reflectors 30 is located so as to sandwich the IDT 20 in the propagation direction of the acoustic wave, and reflects the acoustic wave.

Wiring layers 40 coupled to the bus bars 28 are located on the substrate 10. That is, the wiring layers 40 are electrically connected to the comb-shaped electrodes 22. The comb-shaped electrodes 22, the reflectors 30, and the wiring layers 40 have the same layer structure and the same thickness. The comb-shaped electrodes 22, the reflectors 30, and the wiring layers 40 may be formed of a single-layer metal film or a multilayered metal film containing at least one of, for example, aluminum (Al), copper (Cu), titanium (Ti), chrome (Cr), ruthenium (Ru), tungsten (W), molybdenum (Mo), platinum (Pt), and gold (Au). The comb-shaped electrodes 22, the reflectors 30, and the wiring layers 40 have thicknesses of, for example, 300 nm.

The insulating film 50 that covers the comb-shaped electrodes 22 and the reflectors 30 and has apertures 52 on the wiring layers 40 is located on the substrate 10. The insulating film 50 is located so as to be in contact with the comb-shaped electrodes 22, the reflectors 30, and the wiring layers 40. The insulating film 50 is thicker than the comb-shaped electrodes 22, and has a thickness of, for example, 1200 nm. The insulating film 50 has a temperature coefficient of an elastic constant opposite in sign to the temperature coefficient of the elastic constant of the piezoelectric substrate of the substrate 10, and is, for example, a silicon oxide ($SiO_2$) film or a silicon oxide film to which another element is added (for example, a fluorine-added silicon oxide (SiOF) film). The insulating film 50 has a function as a protective film that inhibits the comb-shaped electrodes 22 and the like from being exposed to water and corroded, and a function as a temperature compensation film that inhibits the characteristic change caused by the temperature change. The upper surface of the insulating film 50 is flat except the apertures 52.

The insulating film 54 is located so as to cover the upper surface of the insulating film 50 and the side surfaces of the insulating film 50 in the apertures 52. The insulating film 54 covers the entire of the upper surface of the insulating film 50 and the entire of the side surfaces of the insulating film 50 in the apertures 52. The insulating film 54 has apertures that expose the wiring layers 40. The insulating film 54 has a thickness of, for example, 50 nm. The insulating film 54 has a higher moisture resistance than the insulating film 50. The insulating film 54 is, for example, an aluminum oxide ($Al_2O_3$) film, a silicon nitride (SiN) film, a silicon oxynitride (SiON) film, or a diamond-like carbon (DLC) film. A film with a high moisture resistance means a film with low liquid permeability.

Pads 60 are located so as to be in contact with the upper surfaces of the wiring layers 40 exposed by the apertures 52. The pad 60 extends from the upper surface of the wiring layer 40 to the upper surface of the insulating film 54 through the side surface of the insulating film 54. The pad 60 covers the entire of the side surface of the insulating film 54, that is, the entire of the side surface of the insulating film 50. The pad 60 is formed of a single-layer metal film or a multilayered metal film, and is, for example, a multilayered metal film formed of a Ti layer and an Au layer stacked in this order from a lower side.

Figure 2A:
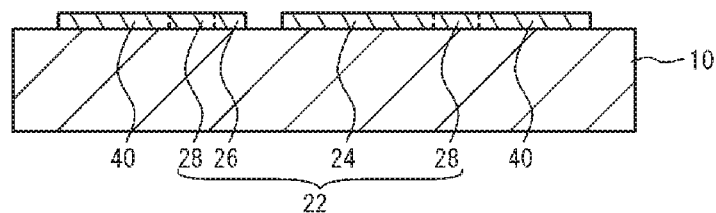
FIG. 2A through FIG. 2E are cross-sectional views illustrating a method of fabricating the acoustic wave resonator of the first embodiment.

A fabrication method of the acoustic wave resonator 100 in accordance with the first embodiment will be described. FIG. 2A through FIG. 2E are cross-sectional views illustrating a method of fabricating the acoustic wave resonator 100 of the first embodiment. As illustrated in FIG. 2A, a metal film is deposited on the substrate 10 by, for example, vacuum evaporation or sputtering, and the metal film is then patterned into a desired shape by etching such as dry etching. This process forms the comb-shaped electrodes 22, the reflectors 30 (not illustrated in FIG. 2A through FIG. 2E), and the wiring layers 40. The comb-shaped electrodes 22, the reflectors 30, and the wiring layers 40 may be formed by vacuum evaporation and liftoff.

Figure 2B:
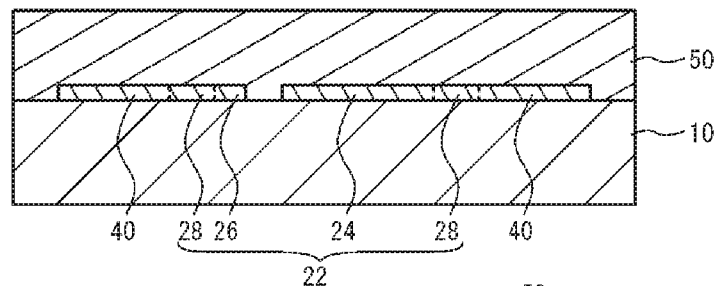

As illustrated in FIG. 2B, the insulating film 50 covering the comb-shaped electrodes 22, the reflectors 30, and the wiring layers 40 are deposited on the substrate 10 by, for example, chemical vapor deposition (CVD) or sputtering. The insulating film 50 is thicker than the comb-shaped electrodes 22, the reflectors 30, and the wiring layers 40. After the insulating film 50 has been deposited, a planarizing process for planarizing the upper surface of the insulating film 50 is executed. The planarizing process is executed by, for example, chemical mechanical polishing (CMP) or etching.

Figure 2C:
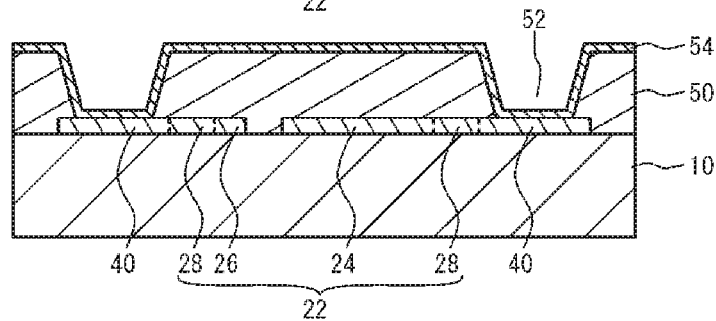

As illustrated in FIG. 2C, the insulating film 50 on the wiring layers 40 is removed by wet etching or dry etching to form the aperture 52 exposing the upper surfaces of the wiring layers 40. Then, the insulating film 54 is formed on the substrate 10 by, for example, sputtering (for example, electron cyclotron resonance (ECR) sputtering, CVD, or atomic layer deposition (ALD). The insulating film 54 is formed so as to cover the upper surface of the insulating film 50, the side surfaces of the insulating films 50 in the apertures 52, and the upper surfaces of the wiring layers 40 exposed by the apertures 52.

Figure 2D:
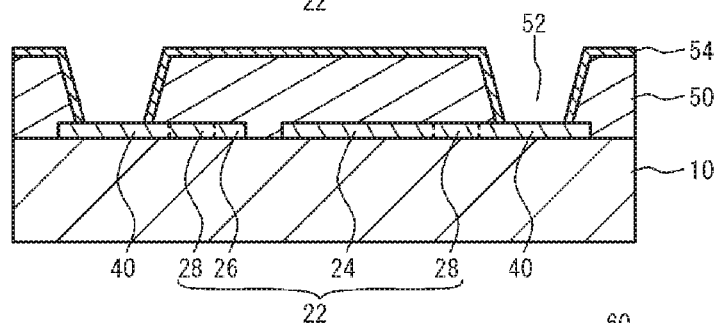

As illustrated in FIG. 2D, the upper surfaces of the wiring layers 40 are exposed by removing the insulating film 54 on the wiring layers 40 by wet etching or dry etching while the insulating film 54 formed on the upper surface of the insulating film 50 and the side surfaces of the insulating film 50 in the apertures 52 is left.

Figure 2E:
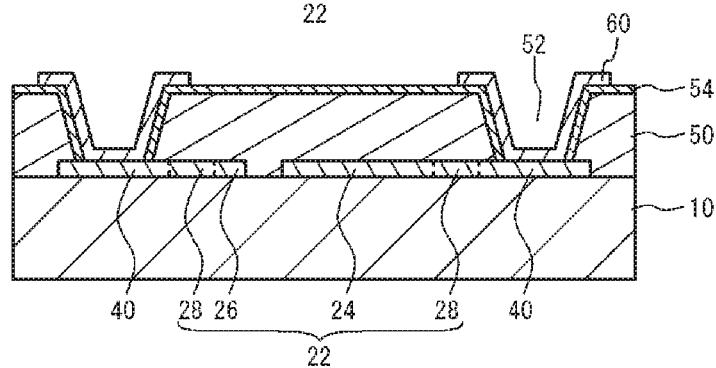

As illustrated in FIG. 2E, the pads 60 are formed by, for example, vacuum evaporation and liftoff on the upper surfaces of the wiring layers 40 exposed by the apertures 52. The pad 60 is formed so as to extend from the upper surface of the wiring layer 40 to the upper surface of the insulating film 54 through the side surface of the insulating film 54.

Figure 3:
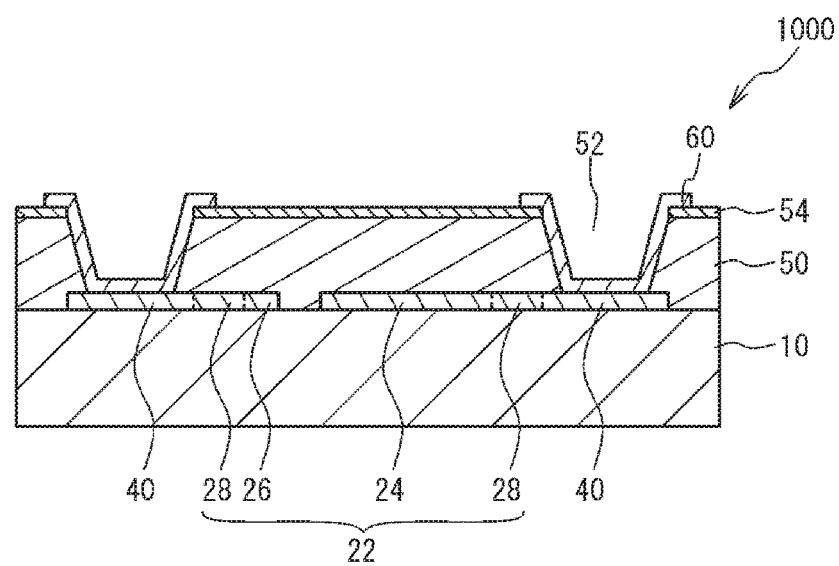
FIG. 3 is a cross-sectional view of an acoustic wave resonator in accordance with a first comparative example.

Here, an acoustic wave resonator of a first comparative example will be described. FIG. 3 is a cross-sectional view of an acoustic wave resonator 1000 in accordance with the first comparative example. As illustrated in FIG. 3, in the acoustic wave resonator 1000 of the first comparative example, the insulating film 54 is only located on the upper surface of the insulating film 50, and is not located on the side surfaces of the insulating film 50 in the apertures 52. Thus, the pads 60 are in contact with the side surfaces of the insulating film 50 in the apertures 52. Other structures are the same as those of the first embodiment, and the description thereof is thus omitted.

In the first comparative example, the insulating film 54 having a higher moisture resistance than the insulating film 50 is located on the upper surface of the insulating film 50. Thus, the penetration of water from the upper surface of the insulating film 50 into the insulating film 50 is prevented. However, the insulating film 54 is not located on the side surfaces of the insulating film 50 in the apertures 52, and the pads 60 are in contact with the side surfaces of the insulating film 50. The pads 60 being in contact with the side surfaces of the insulating film 50 inhibit water from penetrating from the side surfaces of the insulating film 50 into the insulating film 50 to some extent. However, since the pads 60 are formed of a metal film, water gradually penetrates into the pads 60, and eventually penetrates into the insulating film 50. In addition, when the pad 60 includes an Au layer, since Au is easily migrated by water, Au in the pad 60 moves to the insulating film 50, and the density of the pad 60 decreases. This causes water to easily penetrate into the pad 60, and penetrate into the insulating film 50. Penetration of water into the insulating film 50 peels the insulating film 50 or corrodes the comb-shaped electrodes 22, thereby deteriorating characteristics.

In contrast, in the first embodiment, as illustrated in FIG. 1B, the insulating film 54 having a higher moisture resistance than the insulating film 50 is located so as to cover the upper surface of the insulating film 50 and the side surfaces of the insulating film 50 in the apertures 52. This structure inhibits water from penetrating into the insulating film 50 both in the upper surface and the side surfaces of the insulating film 50. Thus, peeling of the insulating film 50 and corrosion of the comb-shaped electrodes 22 are inhibited. As a result, deterioration of the characteristics is reduced.

Additionally, in the first embodiment, the insulating film 54 covers the entire of the side surfaces of the insulating film 50 in the apertures 52. This structure effectively inhibits water from penetrating from the side surface of the insulating film 50 into the insulating film 50.

In the first embodiment, the pads 60 cover the entire of the side surfaces of the insulating film 50 in the apertures 52. As described above, provision of the pads 60 also inhibits penetration of water. Thus, penetration of water into the insulating film 50 is further inhibited.

Since the insulating film 54 is preferably a film having a high moisture resistance that makes water penetrate poorly, the insulating film 54 is preferably a film having a higher density (mass per unit volume) than the insulating film 50. The $Al_2O_3$ film, the SiN film, the SiON film, and the DLC film described as examples of the insulating film 54 can be a film having a higher density than the $SiO_2$ film and a silicon oxide film to which another element is added (for example, a SiOF film) described as examples of the insulating film 50.

Here, the experiment conducted by the inventor will be described. The inventor left a $SiO_2$ film, an $Al_2O_3$ film, a SiN film, a SiON film, and a DLC film in a high-temperature, high-humidity environment (85° C., 85% RH) for 120 hours, and then measured the amount of water that had penetrated into each insulating film by secondary ion mass spectroscopy (SIMS). Experimental results revealed that the $Al_2O_3$ film, the SiN film, the SiON film, and the DLC film had smaller diffusion coefficients than the $SiO_2$ film. The diffusion coefficient of the insulating film with which it takes 1000 hours for water to reach a depth of 20 nm from the surface of the insulating film was $8.0 \times 10^{-22}$ m$^2$/S, and the diffusion coefficient of the insulating film with which it takes 10000 hours was $1.3 \times 10^{-22}$ m$^2$/s. Therefore, the insulating film 54 is preferably a film having a diffusion coefficient of $8.0 \times 10^{-22}$ m$^2$/s or less, more preferably a film having a diffusion coefficient of $1.3 \times 10^{-22}$ m$^2$/s or less.

The inventor formed $Al_2O_3$ films changing at least one of a film formation method and a film forming condition, and then evaluated water in the $Al_2O_3$ films by thermal desorption spectroscopy (TDS). The first peak of water (18 m/z) was detected at a temperature equal to or greater than 0° C. and less than 500° C., and the second peak of water (18 m/z) was detected at a temperature equal to or greater than 500° C. and less than 1000° C. The first peak is due to water existing on the surface of the $Al_2O_3$ film, and the second peak was due to water existing in the $Al_2O_3$ film. As described above, the insulating film containing water thereinside may be formed depending on the film formation method or the like of the insulating film, and the water may affect on the comb-shaped electrode or the like. Thus, the peak intensity of water (18 m/z) detected by TDS at a temperature equal to or greater than 500° C. and less than 1000° C. of the insulating film 54 is preferably equal to or less than the peak intensity of water (18 m/z) detected by TDS at a temperature equal to or greater than 0° C. to less than 500° C.

As described in FIG. 2C, the insulating film 54 may be formed by any one of sputtering, CVD, and ALD. To form the dense (fine) insulating film 54, the insulating film 54 is preferably formed by sputtering (for example, ECR sputtering) or ALD. Since ALD may use gas containing water to form a film, the insulating film 54 containing water thereinside may be formed. Thus, the insulating film 54 is more preferably formed by sputtering (e.g., ECR sputtering).

In the first embodiment, the pad 60 is formed of a multilayered metal film of a Ti layer and an Au layer, but may be formed of other films. For example, the pad 60 may be formed of a multilayered metal film of a Ti layer and a Pt layer. However, as described above, when the pad 60 includes an Au layer, water easily penetrates to the pad 60, and thus water easily penetrates into the insulating film 50 because Au is easily migrated. Thus, when the pad 60 includes an Au layer, the insulating film 54 is preferably located so as to cover the side surfaces of the insulating film 50 in the apertures 52.

Second Embodiment

Figure 4A:
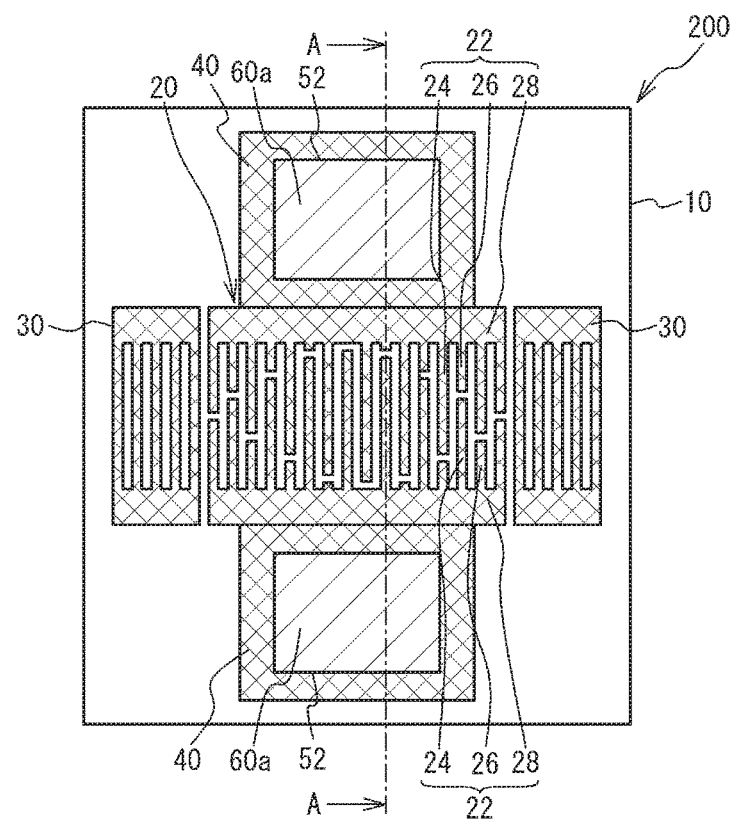
FIG. 4A is a plan view of an acoustic wave resonator in accordance with a second embodiment.
Figure 4B:
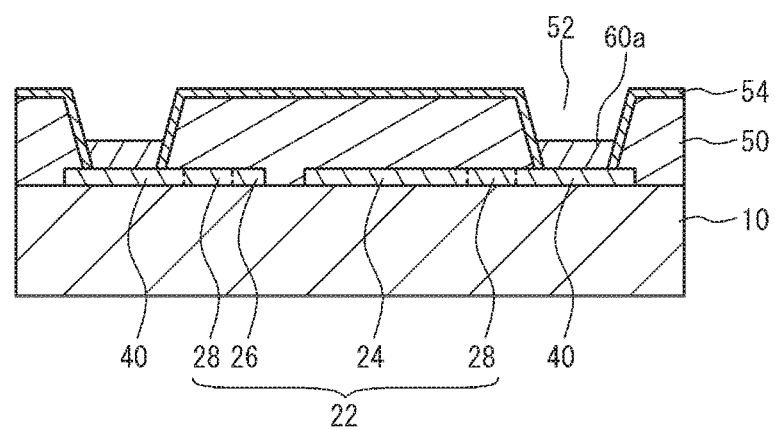
FIG. 4B is a cross-sectional view taken along line A-A in FIG. 4A.

FIG. 4A is a plan view of an acoustic wave resonator 200 in accordance with a second embodiment, and FIG. 4B is a cross-sectional view taken along line A-A in FIG. 4A. As illustrated in FIG. 4A and FIG. 4B, in the acoustic wave resonator 200 of the second embodiment, pads 60a are only located in the apertures 52, and do not extend onto the insulating film 50. That is, the pads 60a only cover the lower parts of the side surfaces of the insulating film 50 in the apertures 52, and do not cover the upper parts. Other structures are the same as those of the first embodiment, and thus, the description thereof is thus omitted.

In the second embodiment, the pads 60a cover only parts of the side surfaces of the insulating film 50 in the apertures 52. Even in this structure, because the insulating film 54 having a high moisture resistance is located so as to cover the upper surface of the insulating film 50 and the side surfaces of the insulating film 50 in the apertures 52, water is inhibited from penetrating into the insulating film 50. Additionally, the structure designed to have the pad 60a covering only a part of the side surface of the insulating film 50 has advantages that when an acoustic wave resonator is flip-chip bonded (FCB) on the substrate, the pad 60a does not contact with another wiring part located on the substrate.

Third Embodiment

Figure 5A:
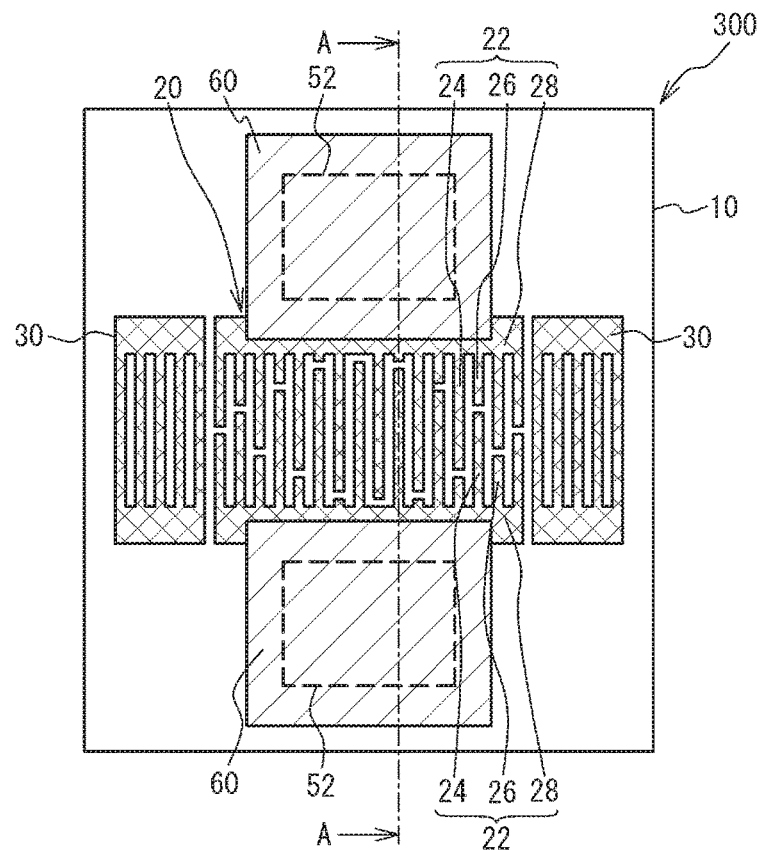
FIG. 5A is a plan view of an acoustic wave resonator in accordance with a third embodiment.
Figure 5B:
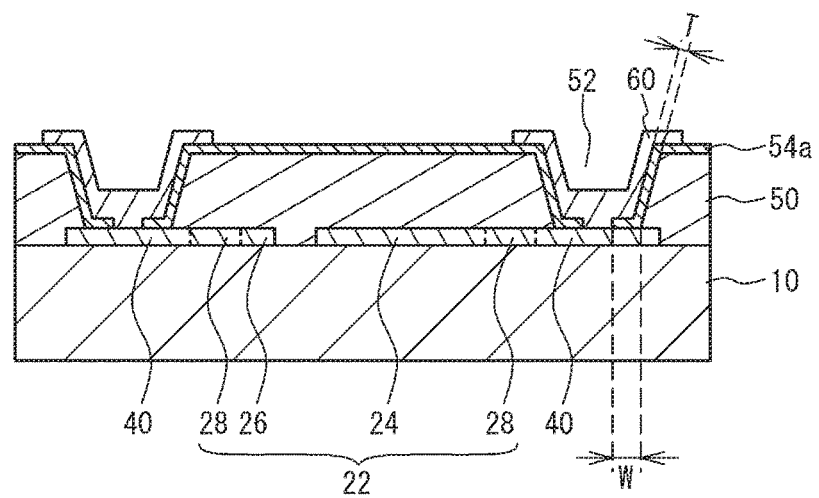
FIG. 5B is a cross-sectional view taken along line A-A in FIG. 5A.

FIG. 5A is a plan view of an acoustic wave resonator 300 in accordance with a third embodiment, and FIG. 5B is a cross-sectional view taken along line A-A in FIG. 5A. As illustrated in FIG. 5A and FIG. 5B, in the acoustic wave resonator 300 of the third embodiment, on the upper surface of the wiring layer 40, an insulating film 54a extends toward the center of the aperture 52. That is, the width W of the insulating film 54a on the upper surface of the wiring layer 40 is greater than the thickness T of the insulating film 54a located on the upper part of the side surface of the insulating film 50 in the aperture 52. The insulating film 54a is continuously formed from the upper surface of the insulating film 50 to the wiring layer 40, and the width W of the insulating film 54a on the upper surface of the wiring layer 40 is less than the width of the aperture 52 surrounded by the insulating film 50. Other structures are the same as those of the first embodiment, and thus the description thereof is thus omitted.

In the third embodiment, the width W of a part being in contact with the wiring layer 40 of the insulating film 54a is greater than the thickness T of the insulating film 54a located on the upper part of the side surface of the insulating film 50 in the aperture 52. This structure makes the part being in contact with the wiring layer 40 of the insulating film 54a long, thus effectively inhibiting water from penetrating into the insulating film 50 through the boundary face between the wiring layer 40 and the insulating film 54a.

Fourth Embodiment

Figure 6A:
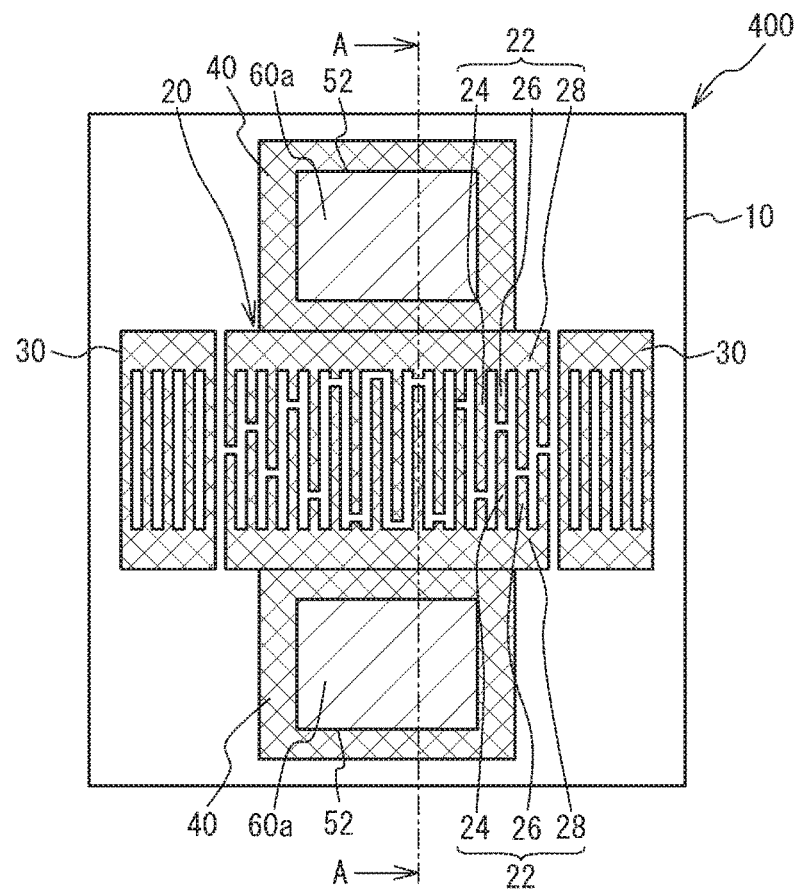
FIG. 6A is a plan view of an acoustic wave resonator in accordance with a fourth embodiment.
Figure 6B:
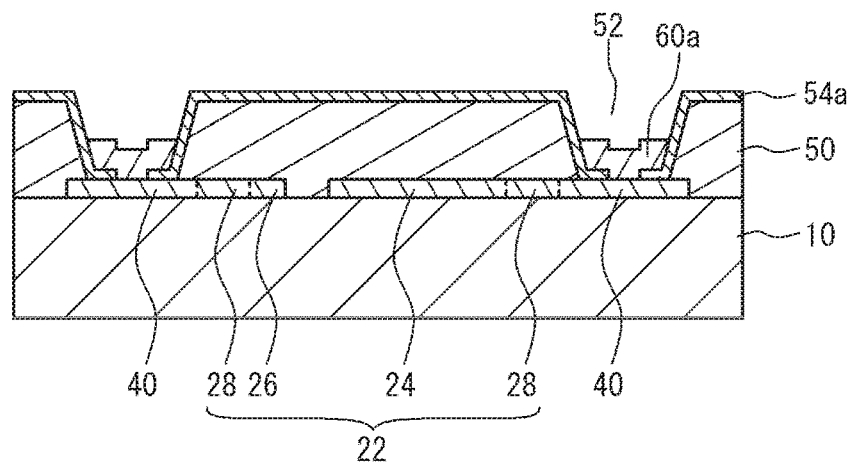
FIG. 6B is a cross-sectional view taken along line A-A in FIG. 6A.

FIG. 6A is a plan view of an acoustic wave resonator 400 in accordance with a fourth embodiment, and FIG. 6B is a cross-sectional view taken along line A-A in FIG. 6A. As illustrated in FIG. 6A and FIG. 6B, in the acoustic wave resonator 400 of the fourth embodiment, the pads 60a are only located in the apertures 52, and do not extend onto the insulating film 50. That is, the pad 60a covers only the lower part of the side surface of the insulating film 50 in the aperture 52, and does not cover the upper part. Other structures are the same as those of the third embodiment, and the description thereof is thus omitted. As described above, even when the width of the part being in contact with the wiring layer 40 of the insulating film 54a is greater than the thickness of the insulating film 54a located on the upper part of the side surface of the insulating film 50 in the aperture 52, the pad 60a may cover only a part of the side surface of the insulating film 50 in the aperture 52.

Fifth Embodiment

Figure 7:
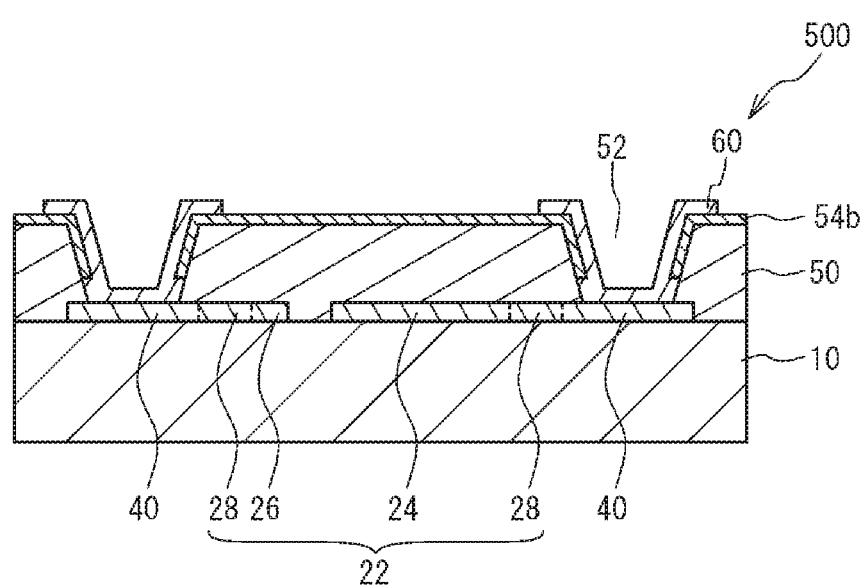
FIG. 7 is a cross-sectional view of an acoustic wave resonator in accordance with a fifth embodiment.

FIG. 7 is a cross-sectional view of an acoustic wave resonator 500 in accordance with a fifth embodiment. As illustrated in FIG. 7, in the acoustic wave resonator 500 of the fifth embodiment, an insulating film 54b is located so as to cover only the upper parts of the side surfaces of the insulating film 50 in the apertures 52, and does not located on the lower parts. The pad 60 is in contact with the lower part, which is not covered with the insulating film 54b, of the side surface of the insulating film 50. Other structures are the same as those of the first embodiment, and the description thereof is thus omitted.

To effectively inhibit water from penetrating into the insulating film 50, as described in the first embodiment, the insulating film 54 preferably covers the entire of the side surface of the insulating film 50. However, the insulating film 54b may cover only a part of the side surface of the insulating film 50 as in the fifth embodiment. That is, penetration of water into the insulating film 50 is inhibited by covering at least a part of the side surface of the insulating film 50 in the aperture 52 with an insulating film having a high moisture resistance.

Alternatively, when the insulating film 54b covers only a part of the side surface of the insulating film 50 as in the fifth embodiment, the side surface of the insulating film 50 not covered with the insulating film 54b is preferably covered with the pad 60.

Sixth Embodiment

Figure 8:
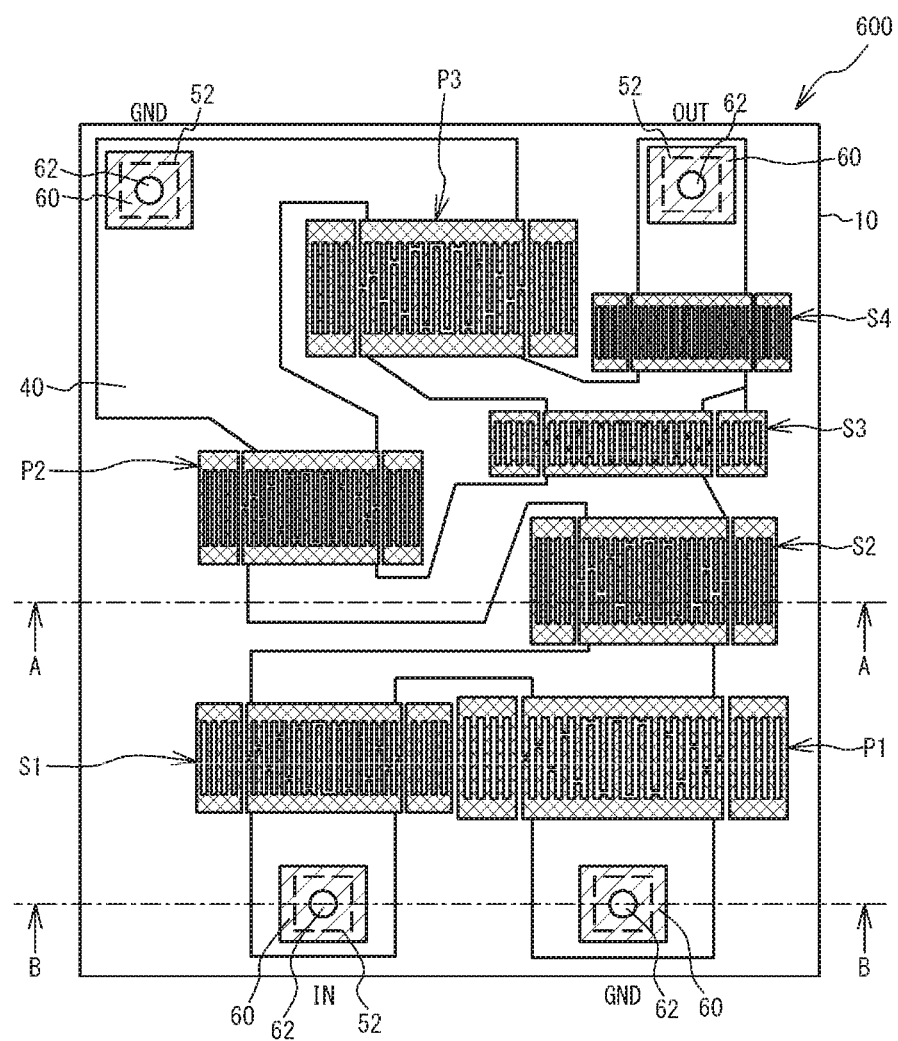
FIG. 8 is a plan view of an acoustic wave filter in accordance with a sixth embodiment.
Figure 9A:
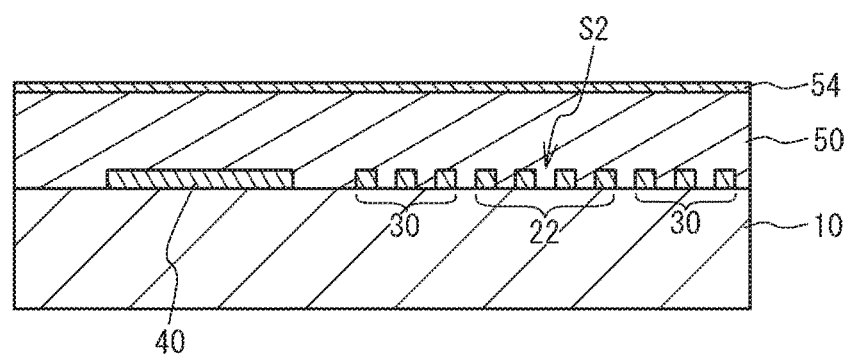
FIG. 9A is a cross-sectional view taken along line A-A in FIG. 8.
Figure 9B:
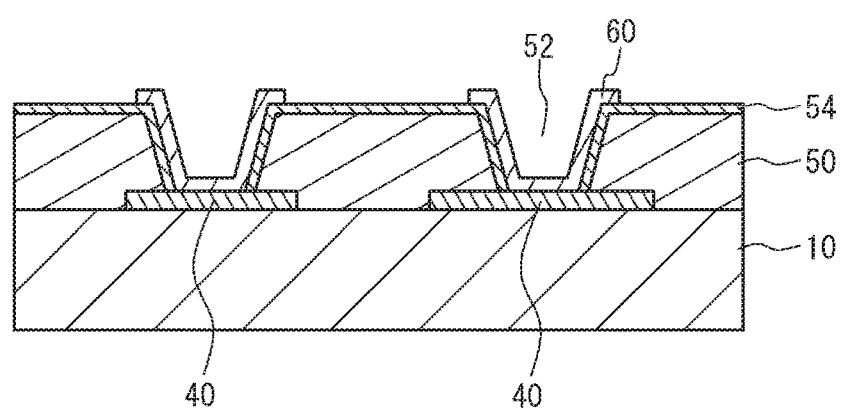
FIG. 9B is a cross-sectional view taken along line B-B in FIG. 8.

FIG. 8 is a plan view of an acoustic wave filter 600 in accordance with a sixth embodiment. FIG. 9A is a cross-sectional view taken along line A-A in FIG. 8, and FIG. 9B is a cross-sectional view taken along line B-B in FIG. 8. FIG. 9B omits the illustration of bumps 62. As illustrated in FIG. 8, the acoustic wave filter 600 of the sixth embodiment is a ladder-type filter including series resonators S1 through S4, parallel resonators P1 through P3, the wiring layers 40, and the pads 60 on the substrate 10. The wiring layers 40 connect between the resonators and connect the resonators with the pads 60. The bumps 62 are located on the pads 60. The bumps 62 are, for example, gold bumps or copper bumps, and, for example, stud bumps or plating bumps.

The series resonators S1 through S4 are connected in series between the pad 60 functioning as an input terminal IN and the pad 60 functioning as an output terminal OUT through the wiring layers 40. First ends of the parallel resonators P1 through P3 are coupled to the series resonators S1 through S4 through the wiring layers 40, and second ends are coupled to the pads 60 functioning as ground terminals GND through the wiring layers 40.

As illustrated in FIG. 9A and FIG. 9B, the insulating film 50 covering the series resonators S1 through S4 and the parallel resonators P1 through P3 and having the apertures 52 on the wiring layers 40 is located on the substrate 10. The insulating film 54 is located so as to cover the upper surface of the insulating film 50 and the side surfaces of the insulating film 50 in the apertures 52. The pads 60 are in contact with the upper surfaces of the wiring layers 40 exposed by the apertures 52.

In the sixth embodiment, the acoustic wave resonator 100 of the first embodiment is used for the series resonators S1 through S4 and the parallel resonators P1 through P3. Thus, water is inhibited from penetrating into the insulating film 50. The acoustic wave resonator of any one of the second through fifth embodiments may be used for the series resonators S1 through S4 and the parallel resonators P1 through P3.

In the first through fifth embodiments, the surface acoustic wave resonator is described as an example of the acoustic wave device, but the acoustic wave device may be a boundary acoustic wave resonator or a Love wave resonator. In addition, in the sixth embodiment, a ladder-type filter is described as an example of the acoustic wave device, but the acoustic wave device may be other acoustic wave filters such as a multimode type filter. Alternatively, the acoustic wave device may be a duplexer using the ladder-type filter or the multimode type filter for the transmit filter and the receive filter.

Although the embodiments of the present invention have been described in detail, it is to be understood that the various change, substitutions, and alterations could be made hereto without departing from the spirit and scope of the invention.

What is claimed is:
1. An acoustic wave device comprising:
    a piezoelectric substrate;
    a comb-shaped electrode located on the piezoelectric substrate;
    a wiring layer located on the piezoelectric substrate and electrically connected with the comb-shaped electrode;
    a first insulating film located on the piezoelectric substrate, the first insulating film covering the comb-shaped electrode, having an aperture on the wiring layer, and being thicker than the comb-shaped electrode;
    a second insulating film covering an upper surface of the first insulating film and an entirety of a side surface of the first insulating film in the aperture and having a higher moisture resistance than the first insulating film; and
    a pad being in contact with the wiring layer exposed by the aperture and covering at least a part of a portion of the second insulating film that covers the entirety of the side surface of the first insulating film in the aperture.

2. The acoustic wave device according to claim 1, wherein the pad covers an entirety of the portion of the second insulating film that covers the entirety of the side surface of the first insulating film.

3. The acoustic wave device according to claim 1, wherein the second insulating film has a higher density than the first insulating film.

4. The acoustic wave device according to claim 1, wherein
the first insulating film is a silicon oxide film or a silicon oxide film to which another element is added, and
the second insulating film is an aluminum oxide film, a silicon nitride film, a silicon oxynitride film, or a diamond-like carbon film.

5. The acoustic wave device according to claim 1, wherein the pad includes a gold layer.

6. The acoustic wave device according to claim 4, wherein the another element is fluorine.

7. An acoustic wave device comprising:
piezoelectric substrate;
a comb-shaped electrode located on the piezoelectric substrate;
a wiring layer located on the piezoelectric substrate and electrically connected with the comb-shaped electrode;
a first insulating film located on the piezoelectric substrate, the first insulating film covering the comb-shaped electrode, having an aperture on the wiring layer, and being thicker than the comb-shaped electrode;
a second insulating film covering an upper surface of the first insulating film and at least a part of a side surface of the first insulating film in the aperture and having a higher moisture resistance than the first insulating film; and
a pad being in contact with the wiring layer exposed by the aperture,
wherein a width of a part being in contact with the wiring layer of the second insulating film is greater than a thickness of the second insulating film located on an upper part of the side surface of the first insulating film.

8. The acoustic wave device according to claim 7, wherein the pad covers an entirety of the portion covering the side surface of the first insulating film of the second insulating film.

9. The acoustic wave device according to claim 7, wherein the second insulating film has a higher density than the first insulating film.

10. The acoustic wave device according to claim 7, wherein:
the first insulating film is a silicon oxide film or a silicon oxide film to which another element is added, and
the second insulating film is an aluminum oxide film, a silicon nitride film, a silicon oxynitride film, or a diamond-like carbon film.

11. The acoustic wave device according to claim 7, wherein the pad includes a gold layer.

12. The acoustic wave device according to claim 10, wherein the another element is fluorine.

13. An acoustic wave device comprising:
a piezoelectric substrate;
a comb-shaped electrode located on the piezoelectric substrate;
a wiring layer located on the piezoelectric substrate and electrically connected with the comb-shaped electrode;
a first insulating film located on the piezoelectric substrate, the first insulating film covering the comb-shaped electrode, having an aperture on the wiring layer, and being thicker than the comb-shaped electrode;
a second insulating film covering an upper surface of the first insulating film and a part of a side surface of the first insulating film in the aperture and having a higher moisture resistance than the first insulating film; and
a pad being in contact with the wiring layer exposed by the aperture, covering at least a part of a portion of the second insulating film that covers the part of the side surface of the first insulating film in the aperture and covering another part of the side surface of the first insulating film that is not covered by the second insulating film.

14. The acoustic wave device according to claim 13, wherein the pad covers an entirety of the portion of the second insulating film that covers the part of the side surface of the first insulating film.

15. The acoustic wave device according to claim 13, wherein the second insulating film has a higher density than the first insulating film.

16. The acoustic wave device according to claim 13, wherein:
the first insulating film is a silicon oxide film or a silicon oxide film to which another element is added, and
the second insulating film is an aluminum oxide film, a silicon nitride film, a silicon oxynitride film, or a diamond-like carbon film.

17. The acoustic wave device according to claim 13, wherein the pad includes a gold layer.

18. The acoustic wave device according to claim 16, wherein the another element is fluorine.

* * * * *